(12) United States Patent
Hiroshi et al.

(10) Patent No.: US 6,798,796 B2
(45) Date of Patent: Sep. 28, 2004

(54) ACTIVE WAVELENGTH LOCKING

(75) Inventors: Nakamura Hiroshi, Singapore (SG);
Yuen Chuen Chan, Singapore (SG);
Yee Loy Lam, Singapore (SG)

(73) Assignee: Denselight Semiconductor PTE LTD, Singapore (SG)

( * ) Notice: Subject to any disclaimer, the term of this patent is extended or adjusted under 35 U.S.C. 154(b) by 20 days.

(21) Appl. No.: 10/382,119

(22) Filed: Mar. 5, 2003

(65) Prior Publication Data

US 2003/0179791 A1 Sep. 25, 2003

(30) Foreign Application Priority Data

Mar. 5, 2002 (GB) .............................. 0205111

(51) Int. Cl.[7] .............................. H01S 3/10; H01S 3/13
(52) U.S. Cl. .......................................... 372/20; 372/32
(58) Field of Search ........................... 372/20, 29.01–32

(56) References Cited

U.S. PATENT DOCUMENTS

| | | | | |
|---|---|---|---|---|
| 4,817,100 A | | 3/1989 | Cameron et al. ............. | 372/32 |
| 5,101,291 A | * | 3/1992 | Jopson ........................ | 398/79 |
| 5,153,933 A | * | 10/1992 | Smith et al. .................. | 385/27 |
| 5,379,309 A | * | 1/1995 | Logan, Jr. .................... | 372/18 |
| 6,008,931 A | | 12/1999 | von Helmolt et al. ...... | 359/326 |
| 6,163,553 A | * | 12/2000 | Pfeiffer ......................... | 372/6 |
| 6,163,555 A | * | 12/2000 | Siddiqui et al. .............. | 372/32 |

FOREIGN PATENT DOCUMENTS

| | | |
|---|---|---|
| EP | 1 075 063 A2 | 2/2001 |
| GB | 2 250 394 A | 6/1992 |

OTHER PUBLICATIONS

Silva et al., "Terahertz Span>60–Channel Exact Frequency Dense WDM Source Using Comb Generation and SG–DBR Injection–Locked Laser Filtering", IEEE Photonics Technology Letters, vol. 13, No. 4, Apr. 2001, Pub. No. 1041–1135, p. 370–372.

Johansson, L.A. and Seeds, A.J., "Millimeter–Wave Modulated Optical Signal Generation with High Spectral Purity and Wide–Locking Bandwidth Using a Fiber–Integrated Optical Injection Phase–Lock Loop", IEEE Photonics Technology Letters, vol. 12, No. 6, Jun. 2000, Pub. No. 1041–1135, p. 690–692.

* cited by examiner

*Primary Examiner*—Quyen Leung
(74) *Attorney, Agent, or Firm*—Buckley, Maschoff & Talwalkar LLC (57) ABSTRACT

A wavelength locked tunable laser source comprising a tunable laser source, an optical reference source characterized by a frequency spectrum with two combs of discrete components of different spacing, an optical mixing device and feedback control circuitry. An optical output of the laser source is heterodyned with an output of the optical reference source at the optical mixing device to produce an electrical signal in dependence on a difference beat frequency of the two optical outputs, the feedback control circuitry being operative to process the electrical signal to provide a feedback signal which is used to tune the wavelength of the laser source so as to minimize the beat frequency and thereby substantially lock the wavelength of the laser source to a wavelength in the spectrum of the optical reference source. The use of an optical reference source with a spectrum comprising two frequency combs provides a mechanism for determining the absolute frequency to which the laser has been locked.

14 Claims, 9 Drawing Sheets

PRIOR ART
Figure 1

PRIOR ART

ACTIVE WAVELENGTH LOCKING

This application is a U.S. National filing under 35 U.S.C. §119 hereby claiming priority to GB Application No. 0205111.8, filed Mar. 5, 2002, the contents of which are incorporated herein by reference for all purposes.

FIELD OF THE INVENTION

The present invention relates to a method and apparatus for actively locking the emission wavelength of a light source, and in particular the wavelength locking of a tunable laser diode for use in wavelength division multiplexed systems.

BACKGROUND TO THE INVENTION

There are many applications for which an accurate, frequency stabilized laser source is required and accordingly a range of techniques has been developed by which this may be achieved. For example, spectroscopic studies often require an ultra-narrow linewidth source that is frequency stabilized to a tolerance similar to the linewidth. Such stabilization may be achieved by temperature controlled intracavity etalons with appropriate feedback circuitry. However, this approach is expensive and the lasing wavelength is sensitive to changes in the reference etalons.

Modern optical communication networks often employ wavelength division multiplexing (WDM) to increase data capacity. This in turn requires sources which can be locked in sufficiently close proximity to the accepted frequencies specified in the ITU grid for optical telecommunications. For example, the C-band runs from 191.00 THz to 195.90 THz, allowing for 50 channels at 0.10 THz (100 GHz) spacing. In the future, dense WDM (DWDM) systems will use even closer channel spacing (50 GHz or 25 GHz) to increase the number of channels. It is thus imperative that a source is available, on which data can be encoded by modulation, and that will remain locked to the desired ITU grid frequency with sufficient accuracy. Any significant inaccuracy in absolute frequency, including frequency drift, will lead to cross-talk between channels and thereby compromise data integrity.

Figure 1:
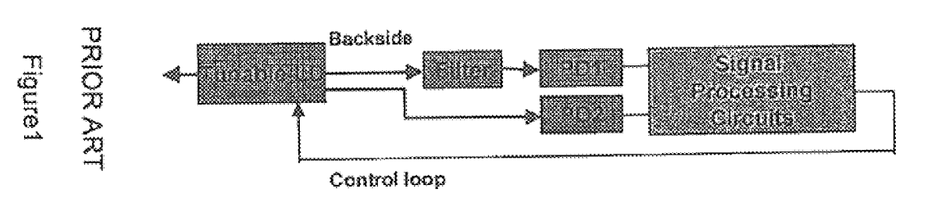
FIG. 1 shows a known system for wavelength locking of a tunable laser diode.

It is also desirable that a DWDM source can produce an optical output at a plurality of the grid frequencies, either simultaneously or discretely by tuning of the lasing wavelength. FIG. 1 shows a known technique for the wavelength locking of a tunable laser diode (LD). A small optical leakage from the back of the LD is amplitude split into two portions, one portion being immediately sampled by a photodetector (PD2), such as a photodiode, the other portion being sampled by another photodetector (PD1) after passing through an optical filter with well-defined transmission characteristics, which often vary periodically with wavelength. Once the system has been calibrated, the difference in the electrical signals from PD1 and PD2 provides information about the wavelength which can be processed to provide a feedback signal for tuning the LD wavelength. A variety of tuning techniques exist, including the distributed Bragg reflector (DBR) and external grating feedback.

Figure 2:
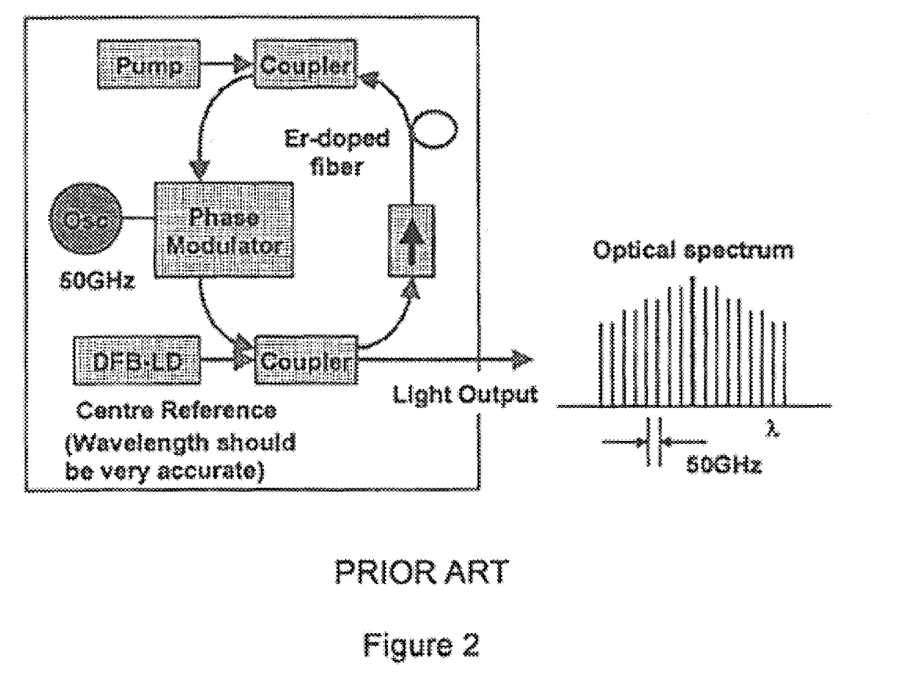
FIG. 2 shows a known system for optical frequency comb generation (OFCG)

An alternative approach for multiple DWDM carrier frequency generation is based on optical frequency comb generation (OFCG). An optical frequency comb generator (OFCG) produces a stable optical signal with a plurality of equally spaced, discrete frequency components, each component typically being characterized by a linewidth much less than the spacing of the discrete components. Many techniques for comb generation are known, including multiple integrated cavity lasers, spectrum slicing of a supercontinuum source, use of non-linear fibre properties and external cavity resonator with integrated phase modulator. FIG. 2 shows a schematic of a popular type of OFCG, the amplified ring, external cavity OFCG, here using an erbium doped fibre (EDF) ring resonator. This approach has the advantages of accurate centre reference frequency, supplied here by injection from a distributed feedback (DFB) LD, tunable comb separation, achieved via an intra-loop phase modulator whose driving frequency can be controlled, and a single frequency stabilization circuit for all generated channels.

The output of an OFCG can be used directly as a DWDM source, simultaneously providing multiple carrier frequencies. However, the frequencies of the discrete carriers cannot be tuned independently, and as the spectrum of an OFCG is typically non-uniform in amplitude, it often requires re-shaping and amplification. Moreover, the carrier frequencies within the optical signal require demultiplexing before information can be encoded on the individual channels.

As a result, an alternative approach has been to use the output of an OFCG to injection lock one or more tunable LDs, in a master-slave arrangement. This type of source has the benefit of a more broadly tunable source, whilst the lasing wavelength can be locked to the appropriate reference contained within the OFCG spectrum. Furthermore, the carrier frequency generated by the LD can be directly modulated, either intra-cavity or extra-cavity, in order to encode data. Despite these benefits, there are a number of factors which can give rise to device complexity and cost.

Due to the nonuniformity of the comb spectrum, it may be necessary to flatten it by means of an external EDF amplifier (EDFA), in order to ensure more uniform spectral power density when injecting several LDs with different frequencies. Optical coupling between the OFCG and the LD can lead to complexity and losses, and may be further complicated by the need to achieve polarization matching. Optical isolation is required to avoid unwanted feedback to the OFCG. Accurate locking to a single comb frequency may only be ensured if the injection locking bandwidth is smaller than the comb spacing, otherwise unwanted line suppression may be required. Finally, despite the use of injection locking, it is still necessary to have control circuitry for electrical tuning and possibly even a feedback loop for accurate frequency stabilization.

There is, therefore, a requirement for a low cost and effective technique for stabilizing the wavelengths of one or more tunable lasers for use in WDM systems, and particularly for the more dense WDM systems, with closer channel spacing, envisaged for the future.

SUMMARY OF THE INVENTION

According to one aspect of the present invention, a wavelength locked tunable laser source comprises:
- a tunable laser source;
- an optical reference source having a frequency spectrum comprising a first comb of discrete components and a second comb of discrete components, the spacing of the discrete frequency components in the second comb being different to the spacing of the discrete frequency components in the first comb;
- an optical mixing device; and,
- feedback control circuitry;
- wherein a portion of an optical output of the laser source is heterodyned with a portion of an output of the optical reference source at the optical mixing device to produce an electrical signal in dependence on a difference beat frequency of the two optical outputs, the feedback control circuitry being operative to process the electrical signal to provide a feedback signal which is used to tune the optical wavelength of the laser source such that the beat frequency is minimized, thereby, in use, substantially locking the wavelength of the laser source to a wavelength in the frequency spectrum of the optical reference source.

Preferably, the tunable laser source is locked to a frequency component in the first comb.

The use of an optical reference source with an optical spectrum comprising two frequency combs provides an aid to determining the absolute frequency to which the laser has been locked.

Preferably, a component in the second comb and a component in the first comb are at substantially the same frequency, a reference frequency.

Preferably, the reference frequency is the centre frequency in the spectrum of the first comb.

Preferably, the difference between the frequency spacing in the first comb and second comb is less than the frequency spacing in the first comb divided by a multiple of the number of frequency components in the first comb that are of interest. Preferably, the multiple is two, more preferably five and most preferably ten.

Preferably, the amplitude of the frequency components in the second comb is substantially less than the amplitude of the frequency components in the first comb. This allows the lasing frequency to be preferentially locked to a frequency in the first comb.

Therefore, according to the one aspect of the present invention, if the lasing frequency of the tunable laser is first locked by the feedback loop to a frequency in the first comb, the lowest difference beat frequency arising from subsequently heterodyning an optical output of the laser with the optical output of the optical reference source will be due to the laser output beating with the nearest frequency component in the second comb, thereby producing a unique signature frequency that allows determination of the absolute frequency to which the laser has been locked. If this frequency is not the desired frequency, the laser frequency can be coarsely tuned closer to the desired frequency and the above process repeated. The limit on the difference between frequency spacing in the first comb and second comb serves to ensure that the spacing between corresponding frequency components of interest in the first and second combs does not become so large that there is ambiguity as to the correspondence between frequencies in the two combs and also to limit the microwave frequencies resulting from the difference beating to a range that can be handled by the feedback circuitry.

Preferably, the optical reference source is an optical frequency comb generator (OFCG).

Preferably, the OFCG is an amplified ring, external cavity OFCG. This type of OFCG has the advantages of accurate centre reference frequency, tunable comb separation and a single frequency stabilization circuit for all generated channels. However, any OFCG with a suitable optical spectrum could be used.

Preferably, the spacing of said discrete frequency components can be controlled.

Preferably, the widths of the discrete frequency components are substantially less than the spacing of the discrete frequency components.

As the spectrum of the optical reference source contains many discrete frequency components, the lasing frequency of the tunable laser will tend to be locked to the frequency component in the optical reference source spectrum nearest to the unlocked lasing frequency, which may not be the desired frequency component. Therefore, it is preferred that the frequency of the tunable laser is first coarsely tuned to within one half, and more preferably one quarter, of the comb frequency spacing of the desired frequency component prior to activation of the wavelength locking mechanism.

Preferably, the tunable laser source is a tunable laser diode (LD). Examples of a tunable LD include a distributed feedback (DFB) LD, a distributed Bragg reflector (DBR) LD, a sampled grating DBR (SG-DBR) LD and a vertical cavity surface emitting LD (VCSEL) with cantilevered reflector.

Preferably, the optical mixing device for heterodyning the two optical signals and generating an electrical signal therefrom is an optical detector, such as a photodiode.

The portion of optical output from the tunable laser source, to be used for heterodyning, may be derived by sampling the main optical output of the laser. The main output emerges via an output coupler, which is typically termed the front mirror in a Fabry Perot type laser. However, a result of amplitude splitting the main beam, to provide the sample, is a loss of available optical power from the laser device. Fortunately, there is often a much weaker subsidiary optical output from a laser that may be used, such as leakage via the rear reflector in a Fabry Perot type laser.

Preferably, the optical output of the tunable laser source used for heterodyning is derived from a subsidiary optical output of the laser.

As the subsidiary optical output may be weak, it is preferred that the wavelength locked tunable laser source further comprises an optical amplifier to boost the power of the optical signal prior to heterodyning.

Preferably the optical amplifier is a semiconductor optical amplifier.

As the electrical signal, generated in dependence on the optical beat frequency, may be weak, it is preferred that the feedback circuitry comprises a transimpedance amplifier (TIA) to boost the electrical signal strength.

Preferably, the feedback circuitry further comprises a phase-locked loop (PLL).

Preferably, the feedback circuitry further comprises a static frequency divider, to reduce the frequency of the input electrical signal to the PLL.

Preferably, the frequency of the electrical signal is divided by a factor of 1024.

Preferably, the lasing wavelength of the tunable laser is determined by application of an electric current or voltage to a tuning element in the laser, the electric current or voltage being dependent on the feedback signal.

Examples of laser tuning elements include movable reflectors, which may be mounted on cantilevers and whose position may be controlled either piezo-electrically or electrostatically, distributed feedback (DFB) gain regions and various types of distributed Bragg reflector (DBR) regions.

According to another aspect of the present invention, a wavelength locked tunable laser source comprises an optical reference source and a plurality of tunable laser sources, each with an associated optical mixing device and feedback control circuitry, the wavelength of each of the tunable laser sources being substantially locked to a wavelength in the optical spectrum of the optical reference source.

A wavelength locked tunable laser source, in accordance with this aspect of the present invention, can provide a plurality of spatially separated optical signals each at a different, but well defined, optical frequency. Such a source has many uses but, in particular, may be used as an optical source for DWDM systems of the type used in optical communication systems. Each optical signal may correspond to a different communication channel, such as the frequencies defined on the ITU grid, and be modulated to encode information thereon.

BRIEF DESCRIPTION OF THE DRAWINGS

Examples of the present invention will now be described in detail with reference to the accompanying drawings, in which:

FIG. 7 illustrates the wavelength locking technique of FIG. 6, using a reference signal for accurate absolute frequency determination;

DETAILED DESCRIPTION

Figure 3:
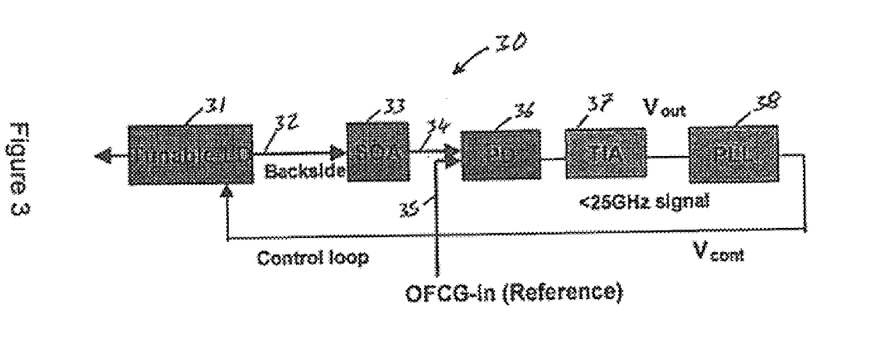
FIG. 3 shows a system for wavelength locking of a tunable laser diode, according to the present invention.

FIG. 3 shows an example of a wavelength locked turntable laser source 30 according to the present invention comprising a tunable laser diode 31 with a wavelength locking mechanism. A small optical leakage 32 from the rear of the laser diode 31 is used to monitor the lasing wavelength of the device. This weak optical signal 32 is amplified in a semiconductor optical amplifier (SOA) 33 and the resulting amplified beam 34 is incident on a photodiode (PD) 36, together with a reference signal 35 taken from the output of an optical frequency comb generator (OFCG). As the PD 36 is an intensity dependent device, a component of the total optical intensity will comprise the product of the laser and OFCG optical field. However, despite the relatively fast response of photodetectors, the only oscillatory components of the total optical signal that the PD 36 can respond to are the difference beat frequencies between the laser signal and the discrete frequency components in the spectrum of the OFCG, thereby performing a heterodyne operation.

The electrical signal generated by the PD 36 contains oscillatory components at microwave frequencies, which are amplified by a transimpedance amplifier (TIA) 37 with a frequency range of up to approximately 25 GHz. Preferably, this amplified signal is passed through a static frequency divider, which by applying a divisor of 1024 to the electrical beat signal can reduce the frequency from 25 GHz to 25 MHz, for example. Frequency-to-voltage circuitry is then employed to produce a voltage $V_{out}$ proportional to the beat frequency. This signal is input to phase-locked looped (PLL) electronics 38 which generate a feedback signal $V_{cont}$ to control the frequency tuning element in the laser diode 31. The PLL circuitry 38 provides a continuously changing feedback control signal $V_{cont}$ until such time as the optical beat frequency, and hence $V_{out}$, is below a particular level. This level may be predetermined or may simply be dictated by the resolution limit of the control electronics. Typically, there will be separate control circuitry for coarse tuning of the laser frequency independent of the wavelength locking feedback loop.

Figure 4:
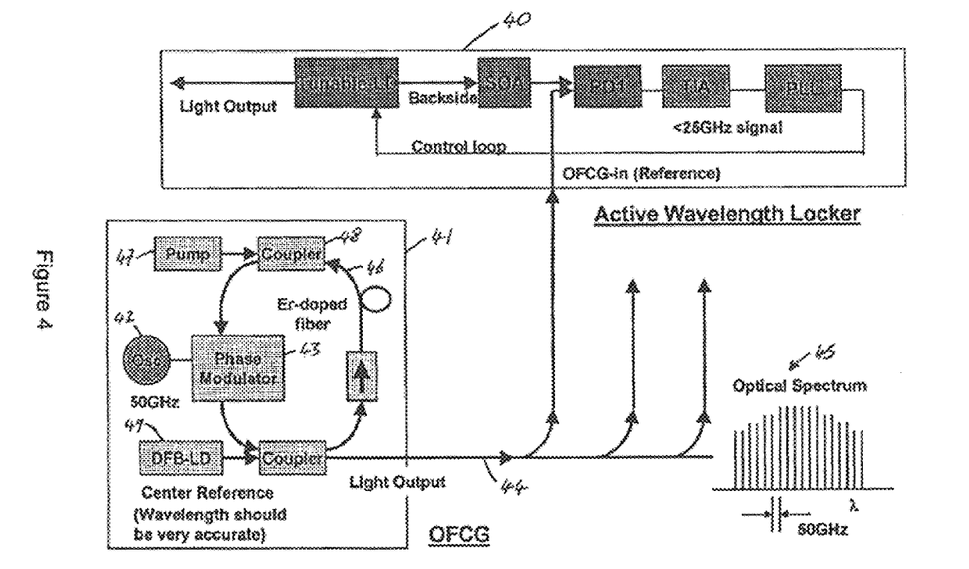
FIG. 4 shows the system of FIG. 3 with a conventional OFCG.

FIG. 4 shows the system 40 of FIG. 3 where an amplified ring, external cavity OFCG 41 of the known type shown in FIG. 2 has been employed. In this example the oscillator 42 drives the intra-loop phase modulator 43 at a frequency of 50 GHz. As a result of this modulation, the external ring cavity produces an optical output 44 with a spectrum 45 comprising a comb of discrete frequencies with a 50 GHz frequency spacing, as depicted. Intra-loop amplification is provided by an Er-doped fibre 46 pumped by a suitable source 47, such as a 980 nm LD. The pump light is coupled into the ring via a suitable wavelength dependent coupler 48, such as a fibre coupler. An Er-amplifier based external resonator is particularly suitable for telecommunications applications due to the coincidence of the amplifiers wavelength range with a substantially portion of the wavelength range used for optical telecommunications systems. The absolute frequencies of the discrete components in the OFCG spectrum are determined by an optical signal injected into the loop from a very stable and accurate reference source, such as a DFB laser diode 49. This reference signal accurately determines the frequency of a discrete component in the centre of the optical comb, from which the other frequency components are referenced. Ideally, this frequency should be the centre frequency in the desired range and should also lie approximately in the middle of the amplification bandwidth of the external cavity.

Figure 5:
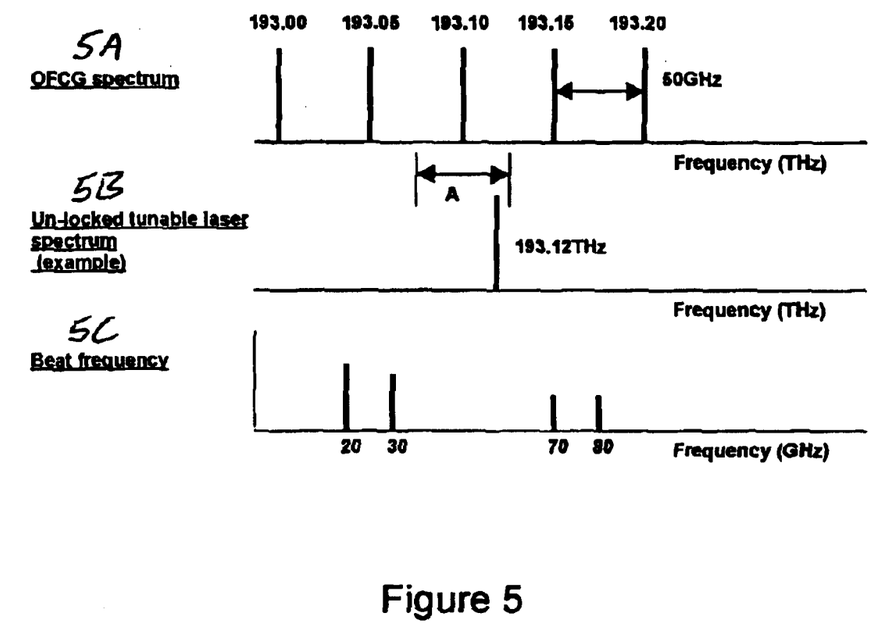
FIG. 5 illustrates wavelength locking by beat frequency minimization, using the system of FIG. 4.

We now describe in detail an example of wavelength locking using the system depicted in FIG. 4, with reference to the optical spectra shown in FIG. 5. The first spectrum 5A shown is a section of the output spectrum of an OFCG, comprising a comb of discrete frequencies commencing at 193.00 THz. This frequency is of particular interest as it lies at the centre of the ITU C-band, which runs from 191.00 THz to 196.00 THz. The frequency spacing of the comb is 50 GHz, as would be obtained from the OFCG shown in FIG. 4.

The second spectrum 5B is the spectrum of a free-running, narrowband tunable LD, comprising a single frequency component at 193.12 THz, which is 20 GHz shifted from the nearest frequency component in the comb at 193.10 THz. It would be expected that a laser coarsely tuned to a frequency in the range 193.075 THz to 193.125 THz, indicated as "A" in FIG. 5, would wavelength lock to the 193.10 THz comb frequency, as this would yield the lowest difference beat frequency when the two signals are heterodyned.

The final spectrum 5C of FIG. 5 shows the initial spectrum of the electrical signal generated by the photodiode in heterodyning the laser and OFCG optical signals. As expected, the lowest frequency component is at 20 GHz, corresponding to beating of the free-running laser signal at 193.12 THz with the comb frequency component at 193.10 THz. The next lowest frequency component is at 30 GHz, corresponding to beating of the free-running laser signal at 193.12 THz with the comb frequency component at 193.15 THz, with higher frequencies occurring at 70 GHz, 80 GHz and so on. Once the wavelength locking electronics are activated a feedback control signal is generated which rapidly tunes the laser frequency so as to minimize the lowest beat frequency. Thus the 20 GHz beat component is quickly reduced towards dc. If the feedback controlled tuning overshoots, such that the laser frequency is tuned below 193.10 THz, the beat frequency will grow again and the feedback loop will act to reduce this back towards dc. The precision with which a lasing frequency of 193.10 THz can be achieved and maintained will depend upon the resolution and speed of the photodiode and feedback circuitry.

The wavelength locking system described above can be modified according to the present invention so as to provide a simple method for accurately determining the absolute frequency in the spectrum of the OFCG to which the laser frequency has been locked. The modified system relies on an OFCG that produces an optical signal with a more complex spectrum. In particular, it is desirable that the spectrum comprises not only a first comb of frequency components, of the type already described, but also comprises a second comb of frequency components, each of which is spaced from a corresponding frequency component in the first comb by a unique amount. The frequency components in the second comb therefore provide a unique identifier associated with a frequency component in the first comb.

Figure 6:
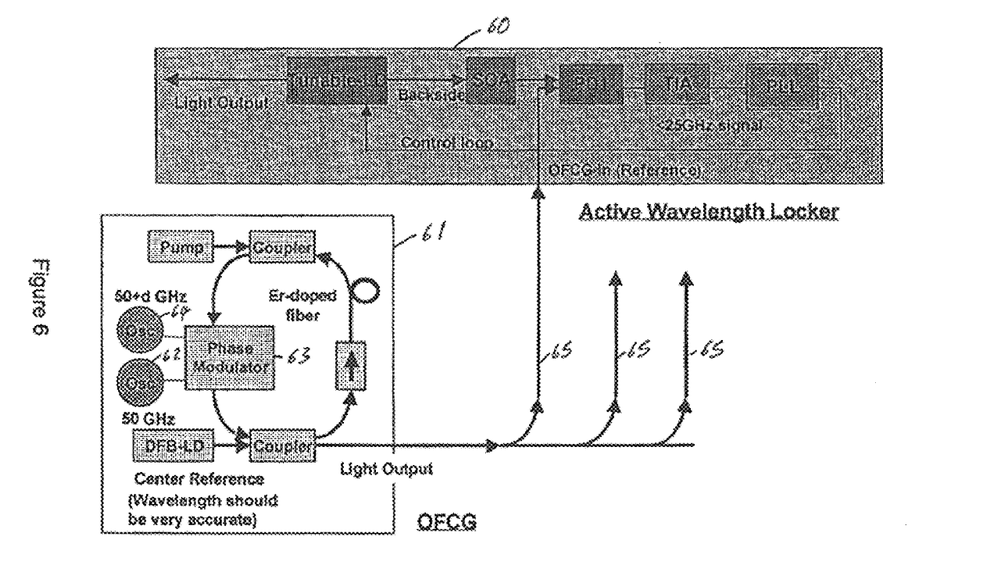
FIG. 6 shows the system of FIG. 3 with an OFCG according to the present invention.

Referring to FIG. 4, one way such a spectrum can be achieved is for the OFCG oscillator 42 to drive the intra-loop phase modulator 43 at two frequencies. Alternatively, as shown in FIG. 6, the phase modulator 63 of the OFCG 61 may be driven by two separate oscillators 62 and 64 at different frequencies. For example, a main driving frequency of 50 GHz and weaker driving frequency of (50+d) GHz, where d is a small frequency difference substantially less than 50 GHz. The second driving frequency will generate a weaker comb of equally-spaced discrete frequencies in addition to the main comb generated and with a different spacing, i.e. (50+d) GHz. The weaker amplitude of the second comb ensures locking of the laser frequency to a frequency in the main first comb.

We now describe in detail an example of wavelength locking with this modified system, with reference to the optical spectra shown in FIG. 7. The first spectrum 7A shown is a section of the output spectrum of the OFCG described above. The spectrum comprises a comb of discrete frequencies which commence at 193.00 THz and are spaced by $\Delta v=50$ GHz, and a corresponding second comb of discrete frequencies spaced from each other by $(\Delta v+d)=(50+d)$ GHz and therefore spaced from the corresponding frequency in the first comb by nd GHz, where n is an integer index which starts at 0 and increments by 1, thereby identifying the position of a particular discrete frequency within the second comb.

The frequency ($v_{1n}$) of components in the first comb increases linearly as follows $$v_{1n}=v_0+n\Delta v \quad n=0 \to N$$

where N denotes the last component of interest in the comb counting up from $v_0$ (at n=0). For $v_0$=193.00 THz and $\Delta v$=50 GHz the components are at frequencies of 193.00, 193.05, 193.10 THz and so on. The frequency ($v_{2n}$) of components in the second comb also increases linearly as follows $$v_{2n}=v_0+n(\Delta v+d) \quad n=0 \to N$$

So for $v_0$=193.00 THz and $\Delta v$=50 GHz the components are at frequencies of 193.00, (193.05+d), (193.10+20) THz and so on.

The second spectrum 7B shown in FIG. 7 is the spectrum of a free-running, narrowband tunable LD, again comprising a single frequency component at $v_L$=193.12 THz, which is 20 GHz shifted from the nearest frequency component in the first comb at 193.10 THz. Similarly to FIG. 5, the expected locking range for this component, 193.075 THz to 193.125 THz, is again indicated as "A".

The third spectrum 7C of FIG. 7 shows the initial spectrum of the electrical signal generated by the photodiode in heterodyning the laser and OFCG signals. As expected, the spectrum now contains difference beat frequencies at all values of $|v_{2n}-v_L|$ in addition to those at $|v_{1n}-v_L|$. The lowest beat frequency is therefore (20–2d) GHz, with 20 GHz being the next lowest beat frequency. However, the stronger amplitude of the 20 GHz signal allows the feedback circuitry to select this component and to preferentially lock the frequency of the laser to it, by reducing the frequency of the 20 GHz beat component towards dc.

Once wavelength locking has been achieved there will still, of course, be a heterodyne spectrum due to the laser signal continuing to beat with the frequencies in the OFCG signal. The last spectrum 7D of FIG. 7 shows the final spectrum of the electrical heterodyned signal after the laser frequency has been locked to 193.10 THz. The lowest beat frequency now occurs at 2d GHz, corresponding to beating with the nearby component in the second comb. The value of n=2, associated with this beat frequency, uniquely identifies the locked frequency of the laser as being that of the second frequency component in the first comb counting up from the reference frequency at $v_0$=193.00 THz.

If the initial coarse tuning of the laser had not successfully positioned its frequency in the A range, the laser would have been locked to a different comb frequency resulting in a lowest post-locking beat frequency corresponding to a different value of n, for example n=3. In this case, the wavelength locking mechanism can be temporarily deactivated while the laser is coarsely retuned closer to the desired frequency. On reactivation of the wavelength locking feedback loop, the lasing frequency is tuned and locked to the desired frequency. Of course this testing, retuning and relocking of the wavelength can be performed either manually or automatically by suitable control electronics.

The range of possible applications of the present invention may be extended further by applying the wavelength locking concept to an array of tunable laser sources. The system shown in FIG. 6 indicated that the output of the OFCG could be split in amplitude to provide an array of optical signals 65, each containing the OFCG reference spectrum. Each of these optical signals can in turn be used as the OFCG reference beam for an array of wavelength (WL) locked tunable lasers of the type 60 shown in FIG. 6. Each of the lasers may be locked to a common frequency in the OFCG spectrum or to different frequencies. A modified OFCG may be used to provide a spectrum comprising a subsidiary comb of frequencies, for accurate wavelength determination. If each laser is locked to a different primary comb frequency, the resulting composite laser source exhibits all the features required of a source suitable for DWDM optical communication systems. For example, a source with a 50 GHz comb spacing and able to cover the entire 5 THz of the ITU C-band could potentially supply the optical signals for 100 distinct communication channels. The source is flexible enough to meet the future requirements of even more dense DWDM systems. By simply reducing the OFCG comb spacing and increasing the number of tunable lasers and locking circuitry, even more channels may be accommodated.

Figure 8:
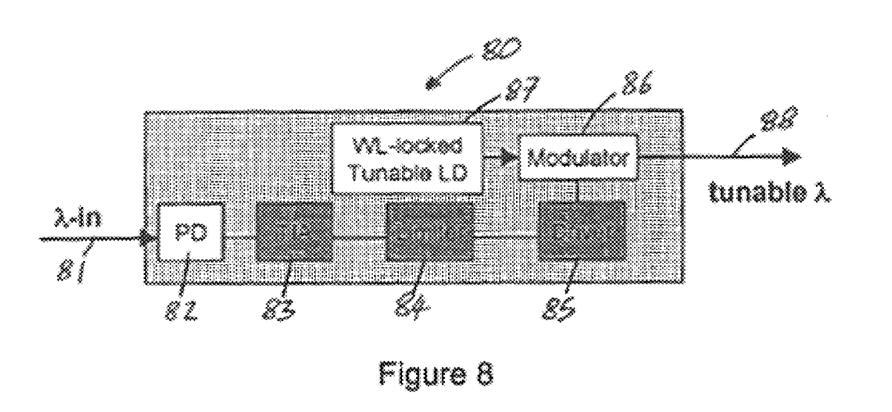
FIG. 8 shows a wavelength converter which utilizes a WL-locked tunable LD, according to the present invention; and, FIG. 9 shows the application of the WL converter of FIG. 8 to an optical cross-connect between two network rings.

One application of the present invention is in a type of wavelength (WL) converter 80 shown in FIG. 8. The aim of this type of optical-electrical-optical (OEO) WL converter 80 is to transfer information encoded on an optical signal 81 at one frequency to an optical signal 88 at a different frequency. As shown, the information encoded on the modulated input beam 81 is detected by a photodiode (PD) 82 and the resulting electrical signal used to drive 85 an optical modulator 86, after passing through a transimpedance amplifier (TIA) 83 and limiter 84. The tunable optical signal, to be modulated with the information, is supplied by a WL-locked tunable LD 87 according to the present invention. This type of system is particularly useful in optical communication systems as information encoded on one ITU grid frequency can easily be recoded on one of a range of different ITU grid frequencies, each of which can be accurately supplied by the WL-locked laser 87.

A variation on the above application is in an array of wavelength converters, wherein each WL converter contains a WL-locked LD, each of the WL-locked lasers receiving their reference signal from a common OFCG. In this way, the device is a combination of a DWDM source with an array of WL converting modules. The composite device is able to receive an array of encoded optical inputs at various frequencies and, by OEO conversion, is able to generate an array of optical outputs encoded with the original information, each optical output being at one of a range of possible frequencies in the OFCG spectrum.

Figure 9:
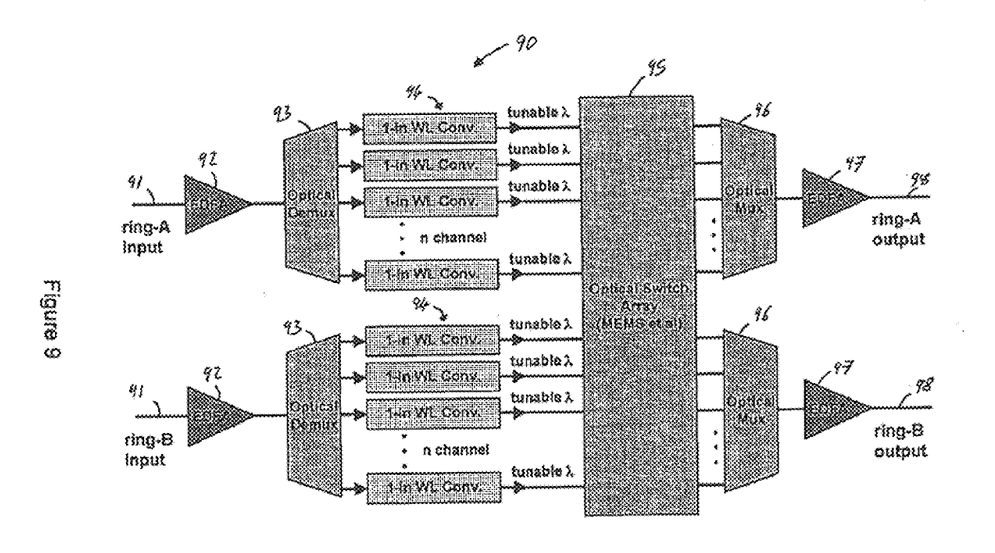

FIG. 9 shows the application of an arrayed WL-converter 94 to an optical cross-connect 90 between two network rings in a DWDM optical telecommunications system. The role of such a cross-connect is to transfer information encoded on one communication channel in a first ring to an available communication channel in a second ring and vice versa. In the example shown, the optical inputs 91 from each of rings A and B are first amplified in an EDFA 92 before being demultiplexed 93 to separate the individual DWDM channels. When switching information between rings A and B, a possible problem is that the frequency of an information bearing channel in ring-A may not be available in ring-B due to prior use. Therefore it is not possible simply to physically re-route the signal from ring-A to ring-B without a potential conflict when the channels are multiplexed for onward transmission.

However, potential conflicts can be substantially mitigated by employing arrayed WL-converters 94 of the type previously described. If a channel frequency in the target ring is already in use, an available channel can be identified and the information on a channel in the source ring can be recoded on the available frequency by a WL-converter. As shown in FIG. 9, physical routing of the information bearing optical signals may then be performed by an optical switch array 95, which may be a MEMS device. Finally the two arrays of switched signals are multiplexed 96 and amplified 97 prior to onward transmission 98 in rings A and B, respectively.

Thus the present invention, and variations thereon, provides a simple method for accurately wavelength locking one or more tunable lasers to a precisely determined reference frequency in a comb of discrete frequencies. Such a source has many applications including applications in optical telecommunications systems. The WL-locked tunable laser may act as a source per se or as a WL-locked tunable source within part of a larger device or system.

What is claimed is:

1. A wavelength locked tunable laser source comprising:
   a tunable laser source;
   an optical reference source having a frequency spectrum comprising a first comb of discrete components and a second comb of discrete components, the spacing of the discrete frequency components in the second comb being different to the spacing of the discrete frequency components in the first comb;
   an optical mixing device; and,
   feedback control circuitry;
   wherein a portion of an optical output of the laser source is heterodyned with a portion of an output of the optical reference source at the optical mixing device to produce an electrical signal in dependence on a difference beat frequency of the two optical outputs, the feedback control circuitry being operative to process the electrical signal to provide a feedback signal which is used to tune the optical wavelength of the laser source such that the beat frequency is minimized, thereby, in use, substantially locking the wavelength of the laser source to a wavelength in the frequency spectrum of the optical reference source.

2. A wavelength locked tunable laser source according to claim 1, wherein the tunable laser source is locked to a frequency component in the first comb.

3. A wavelength lacked tunable laser source according to claim 1, wherein a frequency component in the second comb and a frequency component in the first comb are at substantially the same frequency.

4. A wavelength locked tunable laser source according to claim 1, wherein the optical reference source is an optical frequency comb generator (OFCG).

5. A wavelength locked tunable laser source according to claim 4, wherein the OFCG is an amplified ring, external cavity OFCG.

6. A wavelength locked tunable laser source according to claim 1, wherein the spacing of the discrete frequency components in the spectrum of the optical reference source can be controlled.

7. A wavelength locked tunable laser source according to claim 1, wherein the widths of the discrete frequency components are substantially less than the spacing of the discrete frequency components.

8. A wavelength locked tunable laser source according to claim 1, wherein the tunable laser source is a tunable laser diode.

9. A wavelength locked tunable laser source according to claim 1, wherein the optical mixing device is a photodiode.

10. A wavelength locked tunable laser source according to claim 1, wherein the feedback circuitry comprises a phase-locked loop.

11. A wavelength locked tunable laser source according to claim 1, further comprising:
    a plurality of tunable laser sources;
    a plurality of optical mixing devices; and,
    a plurality of feedback control circuitry;
    wherein, in use, the wavelength of each of the tunable laser sources is substantially locked to a wavelength in the optical spectrum of the optical reference source.

12. A method of wavelength locking a tunable laser source comprising the steps:
    tuning the wavelength of the laser source to within one half of a first comb spacing of an optical reference signal, the optical reference signal having a frequency spectrum comprising a first comb of discrete components and a second comb of discrete components, the spacing of the frequency components in the second comb being different to the spacing of the frequency components in the first comb;

heterodyning a portion of an optical output of the laser source with the optical reference signal;

producing an electrical signal in dependence on a difference beat frequency of the two optical outputs;

processing the electrical signal to provide a feedback signal;

tuning the optical wavelength of the laser source in dependence on the feedback signal such that the difference beat frequency is minimized, thereby substantially locking the wavelength of the laser source to a frequency component in the first comb;

heterodyning a portion of an optical output of the wavelength locked laser source with the optical reference signal, monitoring a lowest difference beat frequency of the laser signal with the second frequency comb; and, determining from the lowest difference beat frequency the frequency component in the first comb to which the laser has been wavelength locked.

13. A method according to claim 12, further comprising the step of:

re-tuning and locking the optical wavelength of the laser source to the desired frequency component in the first comb.

14. A system, comprising:

a plurality of laser sources;

a plurality of optical reference sources, each having a frequency spectrum comprising a first comb of discrete components and a second comb of discrete components, the spacing of the discrete frequency components in the second comb being different to the spacing of the discrete frequency components in the first comb;

a plurality of optical mixing devices, each coupled to receive an optical output of one of said laser sources and an output of one of said optical reference sources and to produce an electrical signal based on a difference beat frequency of the outputs; and a plurality of feedback circuits, each coupled to receive an electrical signal from one of said optical mixing devices, and to provide a feedback signal to one of said laser sources, said feedback signal causing the optical wavelength of the laser source to be tuned such that the beat frequency is minimized and the wavelength is substantially locked to a wavelength in the frequency spectrum of said optical reference source.

* * * * *